United States Patent
Wang et al.

(10) Patent No.: US 7,145,644 B2
(45) Date of Patent: Dec. 5, 2006

(54) DEVICE AND METHOD FOR TESTING AN EXPOSURE APPARATUS

(75) Inventors: Hung-Chi Wang, Taipei (TW); Wei-Feng Lin, Tao-Yuan Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 127 days.

(21) Appl. No.: 10/710,243

(22) Filed: Jun. 29, 2004

(65) Prior Publication Data
US 2005/0190348 A1    Sep. 1, 2005

(30) Foreign Application Priority Data
Feb. 27, 2004    (TW) .............. 93105219 A (51) Int. Cl.
*G03B 27/32* (2006.01)
*G03B 27/68* (2006.01)
*G03B 27/52* (2006.01)

(52) U.S. Cl. .............. 355/77; 355/52; 355/55

(58) Field of Classification Search .............. 355/52, 355/53, 55, 77; 430/5, 20, 30; 356/399–401
See application file for complete search history.

(56) References Cited

U.S. PATENT DOCUMENTS

| | | | | |
|---|---|---|---|---|
| 4,475,811 A | * | 10/1984 | Brunner | 355/133 |
| 5,402,224 A | * | 3/1995 | Hirukawa et al. | 356/124 |
| 5,776,640 A | * | 7/1998 | Bae | 430/5 |
| 6,368,763 B1 | * | 4/2002 | Dirksen et al. | 430/30 |
| 2003/0133099 A1 | * | 7/2003 | Shiode | 356/124 |

* cited by examiner

Primary Examiner—Henry Hung Nguyen
(74) Attorney, Agent, or Firm—Winston Hsu (57) ABSTRACT

A device and a method for testing an exposure apparatus is disclosed. A testing device includes a substrate, and a plurality of block patterns, each of which has a top area varying with an area of a shot region of the exposure apparatus, having at least two different heights located on the substrate. Additionally, the method for testing an exposure apparatus includes using the exposure apparatus to perform an exposure process on the testing device or on the testing device having a photoresist layer thereon, and testing the performance of the exposure apparatus through comparing surface information of the testing device computed by the exposure apparatus with actual surface information of the testing device or through examining photoresist patterns formed on the testing device.

13 Claims, 6 Drawing Sheets

DEVICE AND METHOD FOR TESTING AN
EXPOSURE APPARATUS

BACKGROUND OF INVENTION

1. Field of the Invention

The present invention relates to a device and a method utilized in semiconductor fabrication, and more specifically, to a device and a method for testing an exposure apparatus.

2. Description of the Prior Art

The photolithography process is the most important step in semiconductor fabrication and the process transfers the layout of a designed integrated circuit onto a semiconductor wafer. Typically, to implement the photolithography process, a designed pattern such as a circuit layout pattern or an ion doping layout pattern in accordance with a predetermined design rule is created on one or several mask in advance, and the pattern on the mask is then transferred by light exposure onto a photoresist layer on the wafer.

Additionally, a step-and-scan exposure apparatus is usually applied in the photolithography process. The step-and-scan exposure apparatus includes a light source for generating light beams, a mask stage utilized for holding a mask having a predetermined pattern and moving the mask, a wafer stage utilized for holding a semiconductor wafer and moving the semiconductor wafer, and a surface topography detection system or a height/tilt detection system utilized for measuring a surface topography of the semiconductor wafer.

Before an exposure process is performed on the semiconductor wafer that is put on the wafer stage, the step-and-scan exposure apparatus utilizes the surface topography detection system to measure the surface topography of the semiconductor wafer, thereby obtaining the surface information, which records the surface topography of the semiconductor wafer. Then, the step-and-scan exposure apparatus utilizes the wafer stage to adjust a height or a tilt angle of the semiconductor wafer according to the surface information measured by the surface topography detection system, so that a surface of the semiconductor wafer can be located on a focal plane of the exposure apparatus. Thereafter, light beams such as i-line, KrF laser or ArF laser are generated by the light source of the exposure apparatus, and then, the light beams passing through the mask and projection lenses are projected onto a photoresist layer on the semiconductor wafer for transferring the predetermined pattern of the mask onto a region (or a shot) of the semiconductor wafer. Subsequently, the wafer stage and the mask stage are moved towards different directions for performing the above-mentioned exposure step repeatedly, and therefore, the predetermined pattern of the mask can be transferred onto the entire semiconductor wafer.

As mentioned above, the surface of the semiconductor wafer should be precisely located on the focal plane of the exposure apparatus so that the predetermined pattern of the mask can be accurately transferred onto the entire semiconductor wafer. Accordingly, the calculation function of the surface topography detection system as well as the drive function of the wafer stage should work quite accurately so that the surface of the semiconductor wafer can be precisely located on the focal plane. However, since there are various kinds of step-and-scan exposure apparatuses, it is very hard for process engineers or equipment engineers to immediately verify both the calculation function and the drive function of each exposure apparatus when they survey exposure apparatuses. As a result, it is an important and urgent issue to establish a device and a method for verifying both the calculation function and the drive function of an exposure apparatus.

SUMMARY OF INVENTION

It is therefore a primary objective of the claimed invention to provide a testing device for testing an exposure apparatus.

It is another objective of the claimed invention to provide a testing method for using the testing device of the present invention to test an exposure apparatus.

According to the primary objective of the claimed invention, a testing device for testing an exposure apparatus includes a substrate, and a plurality of block patterns having at least two different heights positioned on the substrate, each of the block patterns having a top area varying with an area of a shot region of the exposure apparatus.

According to another objective of the claimed invention, a method for testing an exposure apparatuses provided. Firstly, a testing device is provided, and the testing device includes a substrate and a plurality of block patterns having at least two different heights positioned on the substrate, each of the block patterns having a top area varying with an area of a shot region of the exposure apparatus. Then, first surface information corresponding to the testing device is provided and the first surface information includes at least a plurality of actual relative heights between the block patterns. Thereafter, the testing device is loaded into the exposure apparatus and an exposure process is performed on the testing device for obtaining second surface information having at least a plurality of relative heights between the block patterns measured by the exposure apparatus. Finally, the first surface information is compared with the second surface information.

According to another objective of the claimed invention, a method for testing an exposure apparatus is provided. Firstly, a testing device is provided and the testing device includes a substrate and a plurality of block patterns having at least two different heights positioned on the substrate, each of the block patterns having a top area varying with an area of a shot region of the exposure apparatus. Then, a photoresist layer is formed on the testing device. Thereafter, the exposure apparatus is used to perform an exposure process on the photoresist layer. Subsequently, a development process is performed on the photoresist layer for forming at least one photoresist pattern on each of the block patterns. Finally, the photoresist patterns are analyzed according to surface information of the testing device.

It is an advantage over the prior art that the surface information of the testing device of the claimed invention is given, so that process engineers or equipment engineers can verify a performance of the exposure apparatus quickly and effectively by utilizing the test device of the claimed invention to test the exposure apparatus.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
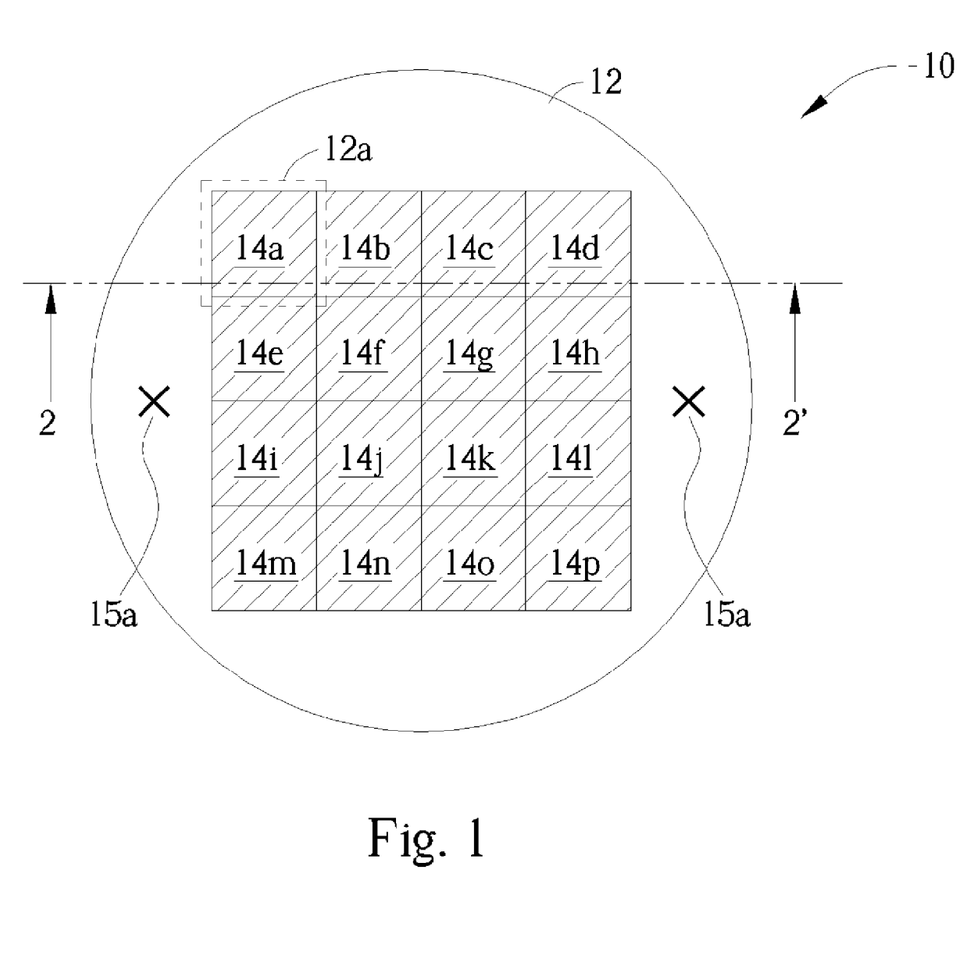
FIG. 1 is a top view of a testing device according to the preferred embodiment of the present invention.
Figure 2:
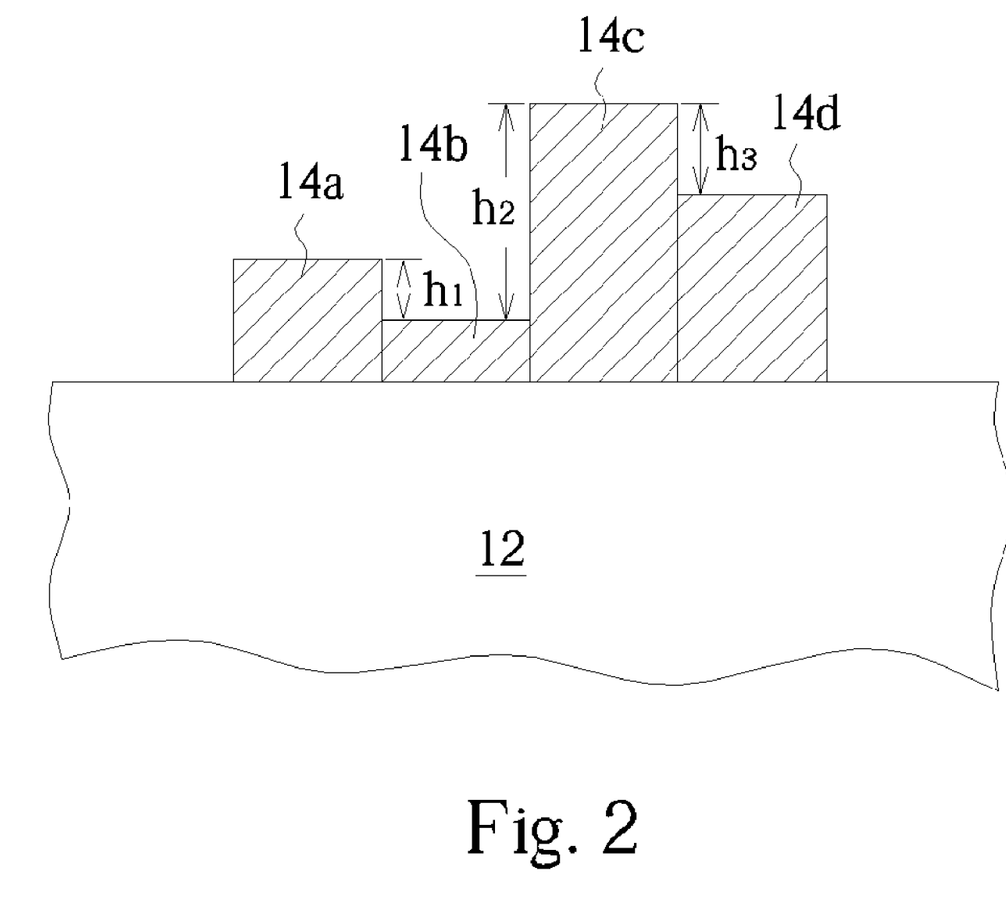
FIG. 2 is a sectional view along line 2–2' of FIG. 1.

Please refer to FIG. 1 and FIG. 2. FIG. 1 is a top view of a testing device according to the preferred embodiment of the present invention. FIG. 2 is a sectional view along line 2–2' of FIG. 1. As shown in FIG. 1, a testing device 10 includes a substrate 12, a plurality of block patterns 14a–14p positioned on the substrate 12, and a plurality of alignment marks 15a positioned on the substrate 12. Additionally, each of the block patterns 14a–14p has a top area varying with an area of a shot region 12a of an exposure apparatus, and the shot region 12a is a region of the substrate 12 that is irradiated by light beams each time a light source of the exposure apparatus projects light beams on the substrate 12. Furthermore, the block patterns 14a–14p have at least two different heights. For example, the heights of the block patterns 14a, 14b, 14c and 14d are different in FIG. 2. Since the testing device 10 is used to verify the calculation function and the drive function of an exposure apparatus, it should be noticed that the distribution of the heights of the block patterns 14a–14p are not limited to those shown in FIG. 2, and that is, the heights of the block patterns 14a–14p can be varied according to requirements of each exposure apparatus. For example, in another embodiment of the present invention, the block patterns arranged in the same row can have the same height, and the block patterns arranged in different rows have different heights. That is, each of the block patterns 14a–14d has a first height, each of the block patterns 14e–14h has a second height, each of the block patterns 14i–14l has a third height, and each of the block patterns 14m–14p has a fourth height. Furthermore, the first height, the second height, the third height and the fourth height are different.

Additionally, a measuring apparatus such as an ellipsometer is firstly used to measure an actual height of each of the block patterns 14a–14p or to measure relative heights, such as $h_1$, $h_2$ and $h_3$ shown in FIG. 2, between the block patterns 14a–14p. After the measurement of the actual heights or the relative heights is completed, the actual heights or the relative heights constitute first surface information that is then stored in a database. In the preferred embodiment of the present invention, the substrate 12 can be a semiconductor substrate such as silicon wafer, or an insulation substrate such as glass substrate or quartz substrate. In addition, the block patterns 14a–14p are usually made by sequentially performing a thin-film deposition process, a photolithography process, and an etching process, and the block patterns 14a–14p can be composed of silicon dioxide, silicon nitride or metallic materials. Furthermore, each of the relative heights between the block patterns 14a–14p is preferably between 0.05 μm and 0.5 μm.

With reference to FIGS. 3–6, methods for utilizing the testing device 10 of the present invention to test a step-and-scan exposure apparatus are described as follows.

Figure 3:
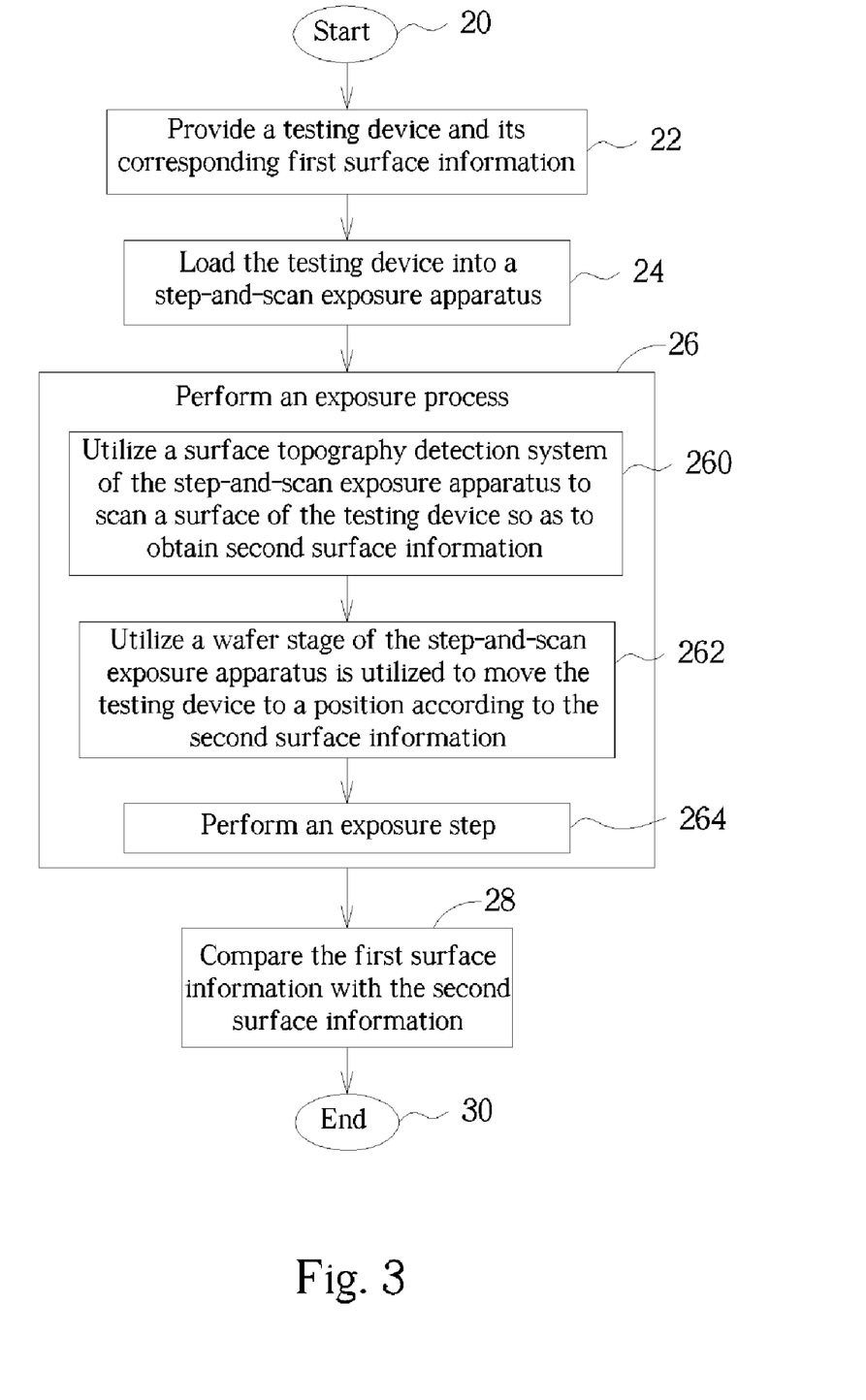
FIG. 3 is a flow chart illustrating a testing method according to the first embodiment of the present invention.

Please refer to FIG. 3. FIG. 3 is a flow chart illustrating a testing method according to the first embodiment of the present invention. As shown in FIGS. 1–3, the first testing method of the present invention includes the following steps.

Step 20: Start.

Step 22: A testing device 10 and its corresponding first surface information are provided. The first surface information may include the actual relative heights between the block patterns 14a–14p.

Step 24: The testing device 10 is loaded into a step-and-scan exposure apparatus. Further, a wafer alignment step can be performed in the step-and-scan exposure apparatus to utilize the alignment marks 15a to align the testing device 10.

Step 26: An exposure process is performed. The exposure process usually includes the following steps.

Step 260: A surface topography detection system of the step-and-scan exposure apparatus is utilized to scan a surface of the testing device 10 so as to obtain second surface information. The second surface information may include the relative heights, measured by the surface topography detection system, between the block patterns 14a–14 p.

Step 262: A wafer stage of the step-and-scan exposure apparatus is utilized to move the testing device 10 to a position, which the second surface information corresponds to.

Step 264: An exposure step is performed to utilize a light source of the step-and-scan exposure apparatus to irradiate the testing device 10.

Step 28: The first surface information is compared with the second surface information.

Step 30: End.

Noticeably, if the exposure process of FIG. 3 is completed smoothly and the data recorded in the first surface information is different from those recorded in the second surface information, it seems that the surface topography detection system cannot precisely measure the surface topography of the testing device 10, and that is, a calculation function of the surface topography detection system works incorrectly. On the contrary, if the exposure process of FIG. 3 is completed smoothly and the data recorded in the first surface information is the same as those recorded in the second surface information, it seems that a calculation function of the surface topography detection system works correctly. Moreover, as shown in FIG. 3, if an error message such as a crash is triggered by the step-and-scan exposure apparatus while the exposure process in the step 26 is performed, the first testing method of the present invention will continue to perform the step 28 to compare the first surface information with the second surface information, and if the data recorded in the second surface information is different from those recorded in the first surface information, it seems that a calculation function of the surface topography detection system works incorrectly. On the contrary, if an error message is triggered by the step-and-scan exposure apparatus while the exposure process is performed and the second surface information is the same as the first surface information, it seems that the wafer stage may not move the testing device 10 to a correct position according to the second surface information, and that is, a drive function of the wafer stage may work incorrectly.

Since the actual values of the relative heights of the block patterns 14a–14p are measured by a measuring apparatus in advance, accuracy of the values measured by the surface topography detection system can be verified by comparing the values measured by the surface topography detection system with the actual values of the relative heights of the block patterns 14a–14p. Therefore, process engineers or equipment engineers can compare calculation functions among different exposure apparatuses quickly and effectively. In addition, because the wafer stage of the exposure apparatus is used to adjust the position of the testing device 10 according to a surface topography of the testing device 10, the testing device 10 including block patterns 14a–14p with different heights can be used to check the largest tilt angle and the largest height that the wafer stage can reach so that process engineers or equipment engineers can compare drive functions among different exposure apparatuses quickly and effectively.

Figure 4:
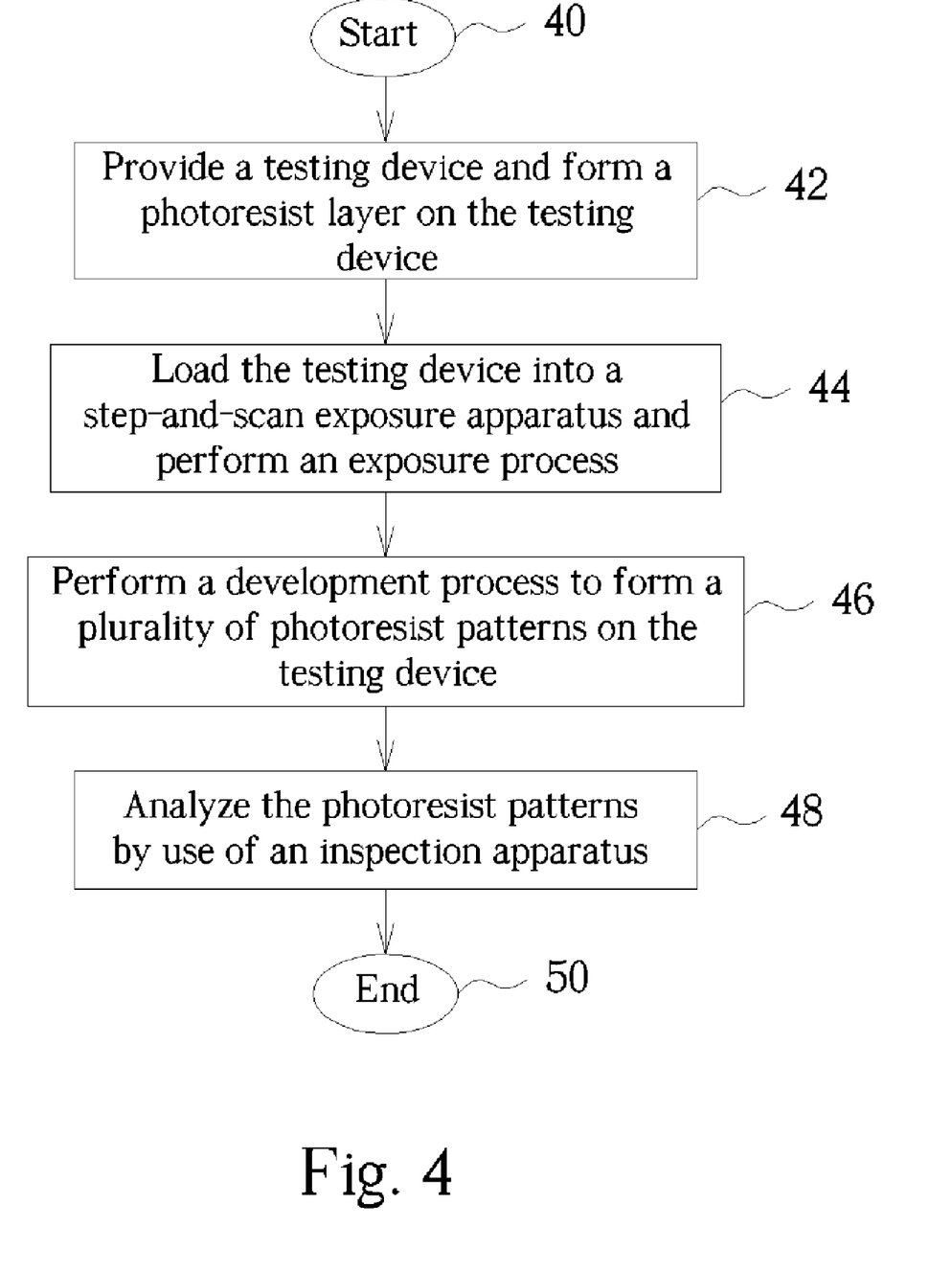
FIG. 4 is a flow chart illustrating a testing method according to the second embodiment of the present invention.
Figure 5:
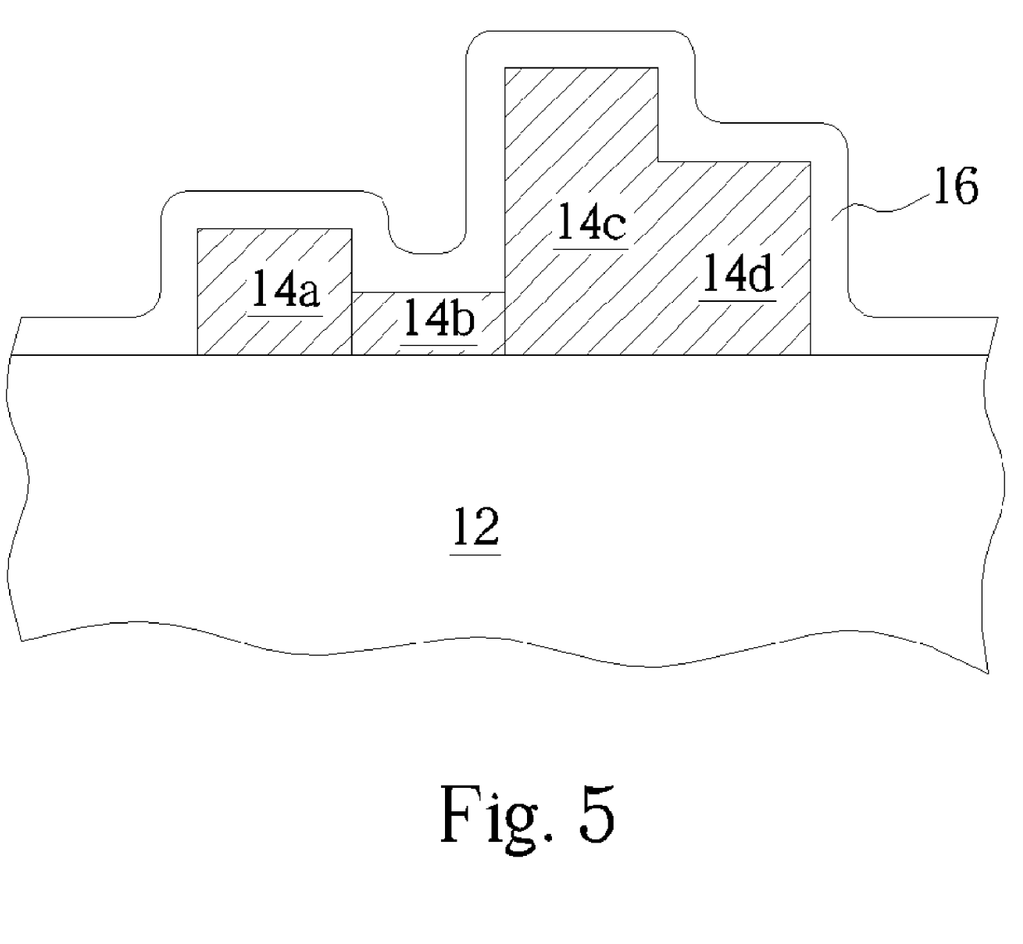
FIG. 5 is a sectional view of the testing device shown in FIG. 1 with a photoresist layer thereon.
Figure 6:
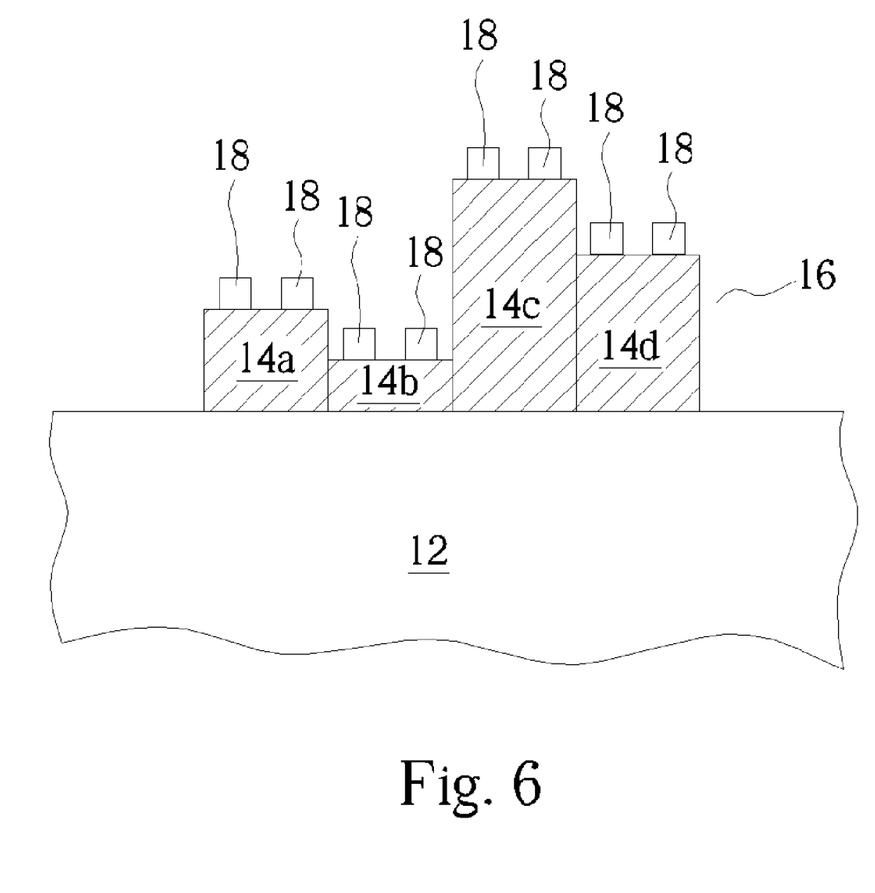
FIG. 6 is a sectional view of the testing device shown in FIG. 1 with a plurality of photoresist patterns thereon.

Please refer to FIGS. 4–6. FIG. 4 is a flow chart illustrating a testing method according to the second embodiment of the present invention. FIG. 5 is a sectional view of the testing device shown in FIG. 1 with a photoresist layer thereon. FIG. 6 is a sectional view of the testing device shown in FIG. 1 with a plurality of photoresist patterns thereon. As shown in FIGS. 4–6, the second testing method of the present invention includes the following steps.

Step 40: Start.

Step 42: A testing device 10 is provided and a photoresist layer 16 is formed on the testing device 10, as shown in FIG. 5.

Step 44: The testing device 10 is loaded into a step-and-scan exposure apparatus and an exposure process is performed. Further, a wafer alignment step can be performed in the step-and-scan exposure apparatus to utilize the alignment marks 15a to align the testing device 10, and the exposure process usually includes the step 260, the step 262 and the step 264 of FIG. 3.

Step 46: A development process is performed to form a plurality of photoresist patterns 18 on the testing device as shown in FIG. 6.

Step 48: The photoresist patterns 18 are analyzed by an inspection apparatus.

Step 50: End.

Referring to FIG. 4, the inspection apparatus used in the step 48 includes a surface analysis apparatus, such as a scanning electron microscope (SEM). Further, the inspection apparatus is used to check whether the photoresist patterns 18 have good quality or to check whether the photoresist patterns 18 are distorted. Additionally, the photoresist patterns 18 can be analyzed with reference to the first surface information having actual heights or actual relative heights of the block patterns 14a–14p on the testing device 10 in order to verify a focus function of the exposure apparatus. For example, if the patterns of the mask in the exposure apparatus have the same line widths, but the photoresist patterns 18 positioned on different block patterns have different line widths, it seems that the exposure apparatus may have problems in its focus system, and that is, a drive function or a calculation function of the exposure apparatus may work incorrectly.

In the second testing method of the present invention, since the block patterns 14a–14p on the testing device 10 have different heights, it can be examined whether a step-and-scan exposure apparatus can perform an exposure process on the testing device 10 precisely or not through observing whether the photoresist patterns 18 on the block patterns 14a–14p have undesired defects, such as defocus or distortion. That is to say, the testing device 10 can be used to examine whether the focus function or the level-controlling function of the step-and-scan exposure apparatus works correctly or not, so that process engineers or equipment engineers can compare performances among different exposure apparatuses quickly and effectively.

The above-mentioned testing methods and the testing device 10 of the present invention are applied in comparing performances among different exposure apparatuses, but the present invention is not limited to that. For example, when engineers doubt that a focus function or a level-controlling function of an exposure apparatus may work incorrectly, the engineers can use to the above-mentioned testing methods and the testing device 10 to check whether the exposure apparatus has problems in the focus function and the level-controlling function.

Additionally, the above-mentioned testing methods and the testing device 10 of the present invention can be applied in not only a step-and scan exposure apparatus but also other kinds of exposure apparatuses such as a stepper.

In comparison with the prior art, the present invention provides the testing device 10 and testing methods for utilizing the testing device 10 to test an exposure apparatus. Since the first surface information recording actual relative heights of the block patterns 14a–14p on the testing device 10 is measured in advance, accuracy of the second information measured by the surface topography detection system can be verified by comparing the second information with the first information. In addition, since the testing device 10 having block patterns 14a–14p with different heights can be used to check the largest tilt angle and the largest height which the wafer stage can reach, a drive function of each kind of exposure apparatus can be verified by process engineers or equipment engineers quickly and effectively.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method for testing an exposure apparatus comprising:
   providing a testing device, the testing device comprising:
      a substrate; and
      a plurality of block patterns having at least two different heights positioned on the substrate, each of the block patterns having a top area varying with an area of a shot region of the exposure apparatus;
   providing first surface information corresponding to the testing device, the first surface information having at least a plurality of actual relative heights between the block patterns;
   loading the testing device into the exposure apparatus and performing an exposure process on the testing device for obtaining second surface information having at least a plurality of relative heights between the block patterns measured by the exposure apparatus; and
   comparing the first surface information with the second surface information.

2. The method of claim 1 wherein the exposure apparatus comprises a surface topography detection system and a wafer stage.

3. The method of claim 2 further comprising:
   using the surface topography detection system to scan a surface of the testing device for obtaining the second surface information;
   using the wafer stage to move the testing device to a corresponding position according to the second surface information; and
   performing an exposure step for projecting light beams onto the surface of the testing device.

4. The method of claim 3 wherein when the exposure process is completed and the second surface information is the same as the first surface information, a calculation function of the surface topography detection system works correctly.

5. The method of claim 3 wherein when the exposure process is completed and the second surface information is not the same as the first surface information, a calculation function of the surface topography detection system works incorrectly.

6. The method of claim 3 wherein when an error message is triggered by the exposure apparatus while the exposure process is performed and the second surface information is not the same as the first surface information, a calculation function of the surface topography detection system works incorrectly.

7. The method of claim 3 wherein when an error message is triggered by the exposure apparatus while the exposure process is performed and the second surface information is the same as the first surface information, a drive function of the wafer stage works incorrectly.

8. The method of claim 1 wherein the testing device further comprises a plurality of alignment marks positioned on the substrate.

9. The method of claim 8 further comprising performing a wafer alignment step in the exposure apparatus for using the alignment marks to align the testing device.

10. A method for testing an exposure apparatus comprising:
   providing a testing device, the testing device comprising:
   a substrate; and
   a plurality of block patterns having at least two different heights positioned on the substrate, each of the block patterns having a top area varying with an area of a shot region of the exposure apparatus;
   forming a photoresist layer on the testing device;
   using the exposure apparatus to perform an exposure process on the photoresist layer;
   performing a development process on the photoresist layer for forming at least one photoresist pattern on each of the block patterns; and
   analyzing topography of the photoresist patterns according to surface information of the testing device.

11. The method of claim 10 wherein the exposure apparatus comprises a surface topography detection system and a wafer stage.

12. The method of claim 10 wherein the testing device further comprises a plurality of alignment marks positioned on the substrate.

13. The method of claim 12 further comprising performing a wafer alignment step to align the testing device with the exposure apparatus by the alignment marks.

* * * * *